US008406050B2

United States Patent
Tang

(10) Patent No.: US 8,406,050 B2
(45) Date of Patent: Mar. 26, 2013

(54) CURRENT SENSING FOR FLASH

(75) Inventor: Qiang Tang, Stanford, CA (US)

(73) Assignee: Micron Technology, Inc., Boise, ID (US)

( * ) Notice: Subject to any disclaimer, the term of this patent is extended or adjusted under 35 U.S.C. 154(b) by 81 days.

(21) Appl. No.: 12/748,741

(22) Filed: Mar. 29, 2010

(65) Prior Publication Data

US 2010/0182843 A1 Jul. 22, 2010

Related U.S. Application Data

(62) Division of application No. 11/486,591, filed on Jul. 14, 2006, now Pat. No. 7,688,635.

(51) Int. Cl.
*G11C 16/06* (2006.01)
(52) U.S. Cl. ......... 365/185.03; 365/185.17; 365/185.18; 365/185.21; 365/185.22; 365/185.33
(58) Field of Classification Search ............. 365/185.03, 365/185.17, 185.18, 185.21, 185.22, 185.33
See application file for complete search history.

(56) References Cited

U.S. PATENT DOCUMENTS

| | | | |
|---|---|---|---|
| 5,748,536 A | 5/1998 | Kwon et al. | |
| 5,757,697 A | 5/1998 | Briner | |
| 6,097,638 A | 8/2000 | Himeno et al. | |
| 6,278,636 B1 * | 8/2001 | Lee | 365/189.15 |
| 6,288,944 B1 | 9/2001 | Kawamura | |
| 6,310,809 B1 | 10/2001 | Roohparvar et al. | |
| 6,327,202 B1 | 12/2001 | Roohparvar | |
| 6,359,821 B1 | 3/2002 | Roohparvar | |
| 6,480,419 B2 * | 11/2002 | Lee | 365/185.18 |
| 6,483,744 B2 * | 11/2002 | Kim et al. | 365/185.03 |
| 6,496,434 B1 | 12/2002 | Nobunaga | |
| 6,519,197 B2 | 2/2003 | Forbes | |
| 6,614,683 B1 | 9/2003 | Parker | |
| 6,671,206 B2 | 12/2003 | Vali et al. | |
| 6,687,161 B2 | 2/2004 | Marotta et al. | |
| 6,798,705 B2 | 9/2004 | Baker | |
| 6,813,190 B2 | 11/2004 | Marotta et al. | |
| 6,822,904 B2 | 11/2004 | Gallo et al. | |
| 6,950,368 B2 | 9/2005 | Morgan | |
| 7,486,562 B2 | 2/2009 | Ogawa et al. | |
| 2005/0226046 A1 | 10/2005 | Lee et al. | |

* cited by examiner

*Primary Examiner* — VanThu Nguyen
(74) *Attorney, Agent, or Firm* — Leffert Jay & Polglaze, P.A.

(57) ABSTRACT

A current sensing data read/verify process and sense amplifier is described that senses memory cells of a non-volatile memory array utilizing a current sensing process that places a current source to provide current to the bit line. The voltage level of the bit line is then set by the current provided by the current source and the current sunk from the bit line through the selected memory cell to the source line, which is dependent on the threshold voltage of its programmed or erased state. If the selected memory cell is erased, current flows through the memory cell to the source line and the bit line voltage falls. If the selected memory cell is programmed, little or no current flows through the cell, and the bit line voltage rises and is sensed by the sense amplifier.

27 Claims, 6 Drawing Sheets

CURRENT SENSING FOR FLASH

RELATED APPLICATION

This is a divisional application of U.S. patent application Ser. No. 11/486,591, titled "CURRENT SENSING FOR FLASH," filed Jul. 14, 2006 and issued as U.S. Pat. No. 7,688,635 on Mar. 30, 2010, which application is assigned to the assignee of the present invention and the entire contents of which are incorporated herein by reference.

TECHNICAL FIELD OF THE INVENTION

The present invention relates generally to memory devices and in particular the present invention relates to EEPROM and Flash memory devices.

BACKGROUND OF THE INVENTION

Memory devices are typically provided as internal storage areas in the computer. The term memory identifies data storage that comes in the form of integrated circuit chips. There are several different types of memory used in modern electronics, one common type is RAM (random-access memory). RAM is characteristically found in use as main memory in a computer environment. RAM refers to read and write memory; that is, you can both write data into RAM and read data from RAM. This is in contrast to ROM, which permits you only to read data. Most RAM is volatile, which means that it requires a steady flow of electricity to maintain its contents. As soon as the power is turned off, whatever data was in RAM is lost.

Computers almost always contain a small amount of read-only memory (ROM) that holds instructions for starting up the computer. Memory devices that do not lose the data content of their memory cells when power is removed are generally referred to as non-volatile memories. An EEPROM (electrically erasable programmable read-only memory) is a special type non-volatile ROM that can be erased by exposing it to an electrical charge. EEPROM comprise a large number of memory cells having electrically isolated gates (floating gates). Data is stored in the floating gate field effect transistor (FET) memory cells in the form of charge on the floating gates. The floating gate is typically made of doped polysilicon, or non-conductive charge trapping layer (a floating node), such as nitride, is disposed over the channel region and is electrically isolated from the other cell elements by a dielectric material, typically an oxide. Charge is transported to or removed from the floating gate or trapping layer by specialized programming and erase operations, respectively, altering the threshold voltage of the device.

Yet another type of non-volatile memory is a Flash memory. A typical Flash memory comprises a memory array, which includes a large number of floating gate memory cells. The cells are usually grouped into sections called "erase blocks." Each of the cells within an erase block can be electrically programmed by tunneling charges to its individual floating gate/node. Unlike programming operations, however, erase operations in Flash memories typically erase the memory cells in bulk erase operations, wherein all floating gate/node memory cells in a selected erase block are erased in a single operation. It is noted that in recent non-volatile memory devices multiple bits have been stored in a single cell by utilizing multiple threshold levels (multi-level cells or MLC) or a non-conductive charge trapping layer with the storing of data trapped in a charge near each of the sources/drains of the memory cell FET.

A NAND architecture array of a EEPROM or Flash also arranges its array of non-volatile memory cells in a matrix of rows and columns, as a conventional NOR array does, so that the gates of each non-volatile memory cell of the array are coupled by rows to word lines (WLs). However, unlike NOR, each memory cell is not directly coupled to a source line and a column bit line. Instead, the memory cells of the array are arranged together in strings, typically of 8, 16, 32, or more each, where the memory cells in the string are coupled together in series, source to drain, between a common source line and a column bit line. It is noted that other non-volatile memory array architectures exist, including, but not limited to AND arrays, OR arrays, and virtual ground arrays.

A problem in modern Flash memory devices is that, as device sizes and features are further reduced with improved processing, the operating current through a memory cell selected for read in the array is reduced. This reduced cell current can allow for difficulty sensing the data value/stored threshold voltage of a selected memory cell during reading and/or verifying the memory cell's stored data value. In particular, sensing difficulties can occur during the reading or verifying of a marginal memory cell, during the sensing of a stored data value that is close to the logical window threshold, or the sensing of the multiple differing possible threshold values of stored data in MLC cells.

For the reasons stated above, and for other reasons stated below which will become apparent to those skilled in the art upon reading and understanding the present specification, there is a need in the art for alternative methods of reading and verifying Flash memory arrays.

DETAILED DESCRIPTION

Figure 1:
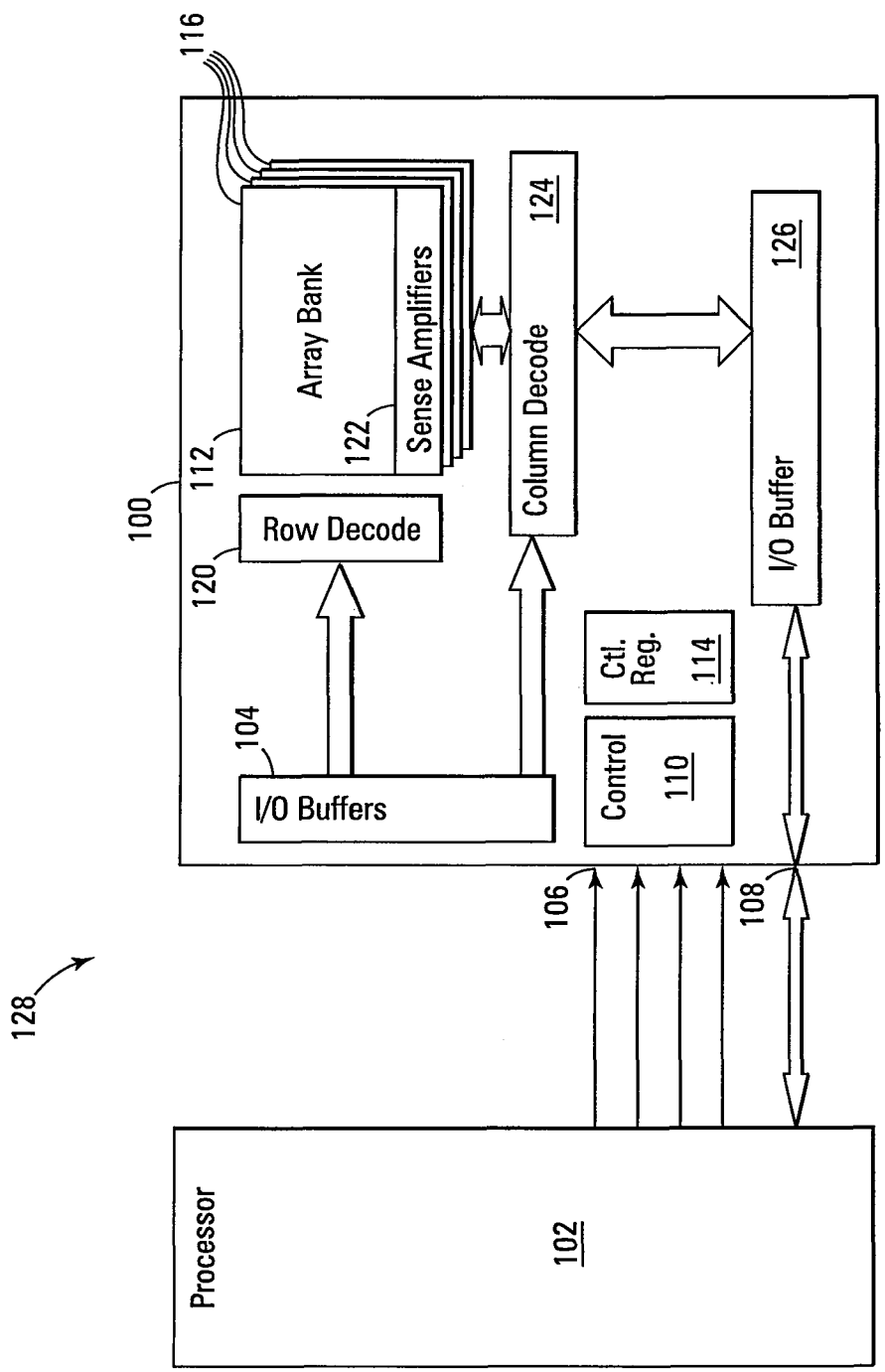
FIG. 1 is a simplified block diagram of a system containing a non-volatile memory device in accordance with an embodiment of the present invention.

In the following detailed description of the preferred embodiments, reference is made to the accompanying drawings that form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The terms wafer or substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the present invention is defined only by the claims.

Embodiments of the present invention include memory devices and arrays that sense data in floating gate or floating node field effect transistor memory cells using a current sensing data read/verify process and sense amplifier. The current sensing process senses memory cells of a non-volatile memory array utilizing a current sensing process that places a current source, such as a pull-up transistor, to source current on to the bit line. The voltage level of the bit line is then set by current differential on the coupled bit line between the current being provided by the current source and the current being sunk from the bit line through the selected memory cell to the source line, which is dependent on the threshold voltage of its programmed or erased state. If the selected memory cell is erased, current flows through the memory cell to the source line and the bit line voltage falls. If the selected memory cell is programmed, little or no current flows through the cell, dependant on the programmed threshold voltage level of the cell and applied read select voltage on the gate of the memory cell, and the bit line voltage rises and is sensed by the sense amplifier. This allows the sense amplifier to operate without having to precharge the bit line to a known voltage level, as conventional non-volatile memory data sensing process and sense amplifier require. In one embodiment, the current source is turned off after a data value has been sensed to reduce power consumption. In another embodiment, a transistor is coupled serially in line with the bit line to form a cascade amplifier to boost sensitivity. In yet another embodiment, NAND architecture memory devices and arrays read the various cells of strings of non-volatile memory cells utilizing a current sensing sense amplifier.

It is noted, while embodiments of the present invention are described in relation to NAND architecture non-volatile read and verify processes, that other memory array architectures, such as NOR architecture memory array and virtual ground memory array embodiments of the present invention, are also possible and will be apparent to those skilled in the art with the benefit of the present invention. It is also noted that embodiments of the present invention include all non-volatile memory cell devices and memories that use Vt to determine data values, such as, but not limited to, memory cells that trap charge in an electrically isolated regions, charge trapping/floating node memory cells and ferromagnetic memory cells, and thus are not limited to floating gate memory cell arrays or memory devices.

FIG. 1 details a simplified diagram of a system 128 incorporating a non-volatile memory device 100 of an embodiment of the present invention connected to a host 102, which is typically a processing device or memory controller. The non-volatile memory 100, such as a Flash memory device, has a control interface 106 and an address/data interface 108 that are each connected to the processing device 102 to allow memory read and write accesses. It is noted that in alternative embodiments, the address/data interface 108 can be divided into separate interfaces. Internal to the non-volatile memory device a control state machine/control circuit 110 directs the internal operation; managing the non-volatile memory array 112 and updating RAM control registers and erase block management registers 114. The RAM control registers and tables 114 are utilized by the control state machine 110 during operation of the non-volatile memory 100. The non-volatile memory array 112 contains a sequence of memory banks or segments 116, each bank 116 is organized logically into a series of erase blocks (not shown). Memory access addresses are received on the address/data interface 108 of the non-volatile memory 100 and divided into a row and column address portions. On a read access, the row address is latched by the interface I/O buffer 104 and decoded by row decode circuit 120, which selects and activates a row page (not shown) of memory cells and the other memory cells in their associated strings across a selected memory bank. The bit values encoded in the output of the selected row of memory cells are connected from a local bit line/string (not shown) to a bit line (not shown) and detected by sense amplifiers 122 associated with the memory bank. The sense amplifiers 122 also typically include a data cache and write data latch circuits (not shown). The column address of the access is also latched by the interface I/O buffer 104 and decoded by the column decode circuit 124. The output of the column decode circuit selects the desired column data from the sense amplifier outputs and connected to the data buffer 126 for transfer from the memory device through the address/data interface 108. It is noted that in one embodiment of the present invention, the column decode 124 may be optionally placed between the memory array 112 and the sense amplifiers 122. On a write access the row decode circuit 120 selects the row page and column decode circuit selects write sense amplifiers 122. Data values to be written are connected from the data buffer 126 to the data cache and then to the write data latches of the write sense amplifiers 122 selected by the column decode circuit 124 and written to the selected non-volatile memory cells (not shown) of the memory array 112. The written cells are then reselected by the row and column decode circuits 120, 124 and sense amplifiers 122 so that they can be read to verify that the correct values have been programmed into the selected memory cells.

As stated above, two common types of non-volatile or Flash memory array architectures are the "NAND" and "NOR" architectures, so called for the resemblance which the basic memory cell configuration of each architecture has to a basic NAND or NOR gate circuit, respectively. In the NAND array architecture, the memory cells of the memory array are arranged in a matrix similar to conventional RAM or ROM, such that the gates of each memory cell of the array are coupled by rows to word lines (WL). However each memory cell is not directly coupled to a source line (SL) and a column bit line (BL), as would be the case in the NOR architecture style (a row and column matrix memory cells, each memory cell coupled between a source line and a bit line). Instead, in NAND, the memory cells of the array are arranged together in strings, typically of 8, 16, 32, or more each, where the memory cells in the string are coupled together in series, source to drain, between a common source line and a column bit line. This allows a NAND array architecture to have a higher memory cell density than a comparable NOR array, but with the cost of a generally slower access rate and programming complexity.

Figure 2:
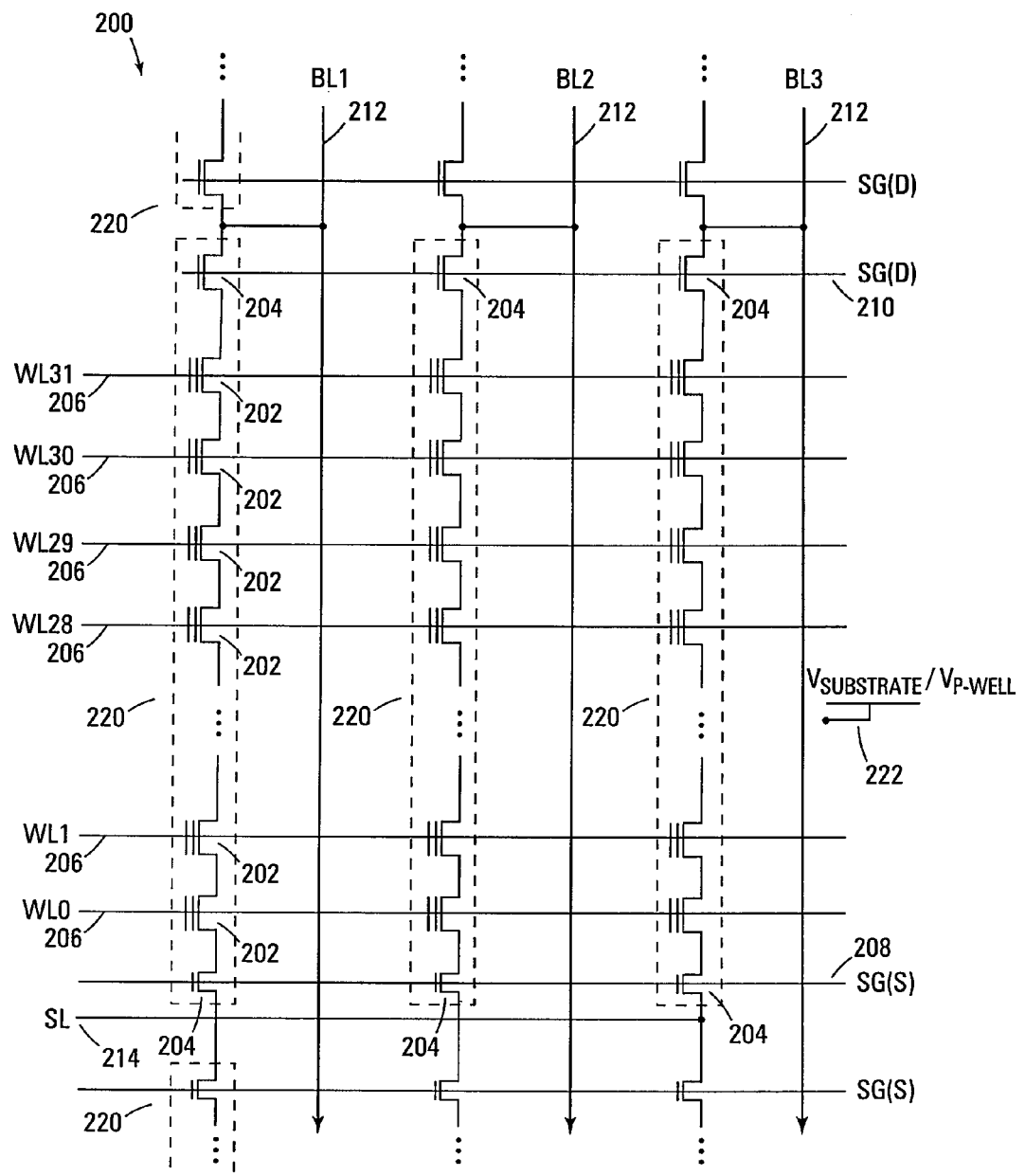
FIG. 2 is a simplified block diagram of a NAND architecture Flash memory array in accordance with an embodiment of the present invention.

FIG. 2 shows a schematic of a simplified NAND architecture floating node or trapping layer memory array 200 of a NAND Flash memory device of an embodiment of the present invention. It is noted that the memory array 200 of FIG. 2 is for illustrative purposes and should not be taken as limiting and that other NAND memory array embodiments of the present invention are possible and will be apparent to those skilled in the art with the benefit of the present disclosure. In FIG. 2, a series of NAND memory strings 220 are arranged in an array 200 and coupled to bit lines 212 and source lines 214. In each NAND memory string 220, a series of floating gate or floating node memory cells 202 of embodiments of the present invention are coupled together source to drain to form the NAND string 220 (typically having 8, 16, 32, or more cells). As described above, each floating gate/node memory cell FET 202 has a gate-insulator stack formed over the channel region. To further enable operation, in one embodiment of the present invention, one or more NAND architecture memory strings 220 of the memory are shown formed in an isolation trench, allowing the substrate of each isolation trench to be individually biased for programming and erasure. The word lines 206 couple across the NAND strings 220, coupling the control gates of adjacent memory cells 202 enabling a single memory cell 202 in each memory string 220 to be selected. In each NAND memory string 220, impurity (N+ typically) doped regions are formed between each gate insulator stack to form the source and drain regions of the adjacent memory cells 202, which additionally operate as connectors to couple the cells of the NAND string 220 together. In one embodiment of the present invention, the N+ doped regions are omitted and a single channel region is formed under the NAND memory string 220, coupling the individual memory cells 202. Each NAND memory string 220 is coupled to select gates 204 that are formed at either end of each NAND string 220 and selectively couple opposite ends of each NAND string 220 to a bit line 212 and a source line 214. The select gates 204 are each coupled to gate select lines, select gate drain {SG(D)} 210 and select gate source {SG(S)} 208, that control the coupling of the NAND strings to the bit lines 212 and source lines 214, respectively, through the select gates 204. In FIG. 2, the substrate connection 222 is shown coupled to each NAND string 220, allowing the memory cells 202 of each NAND string 220 to be biased from the substrate.

A NAND architecture floating gate or floating node memory array is accessed by a row decoder activating a row of memory cells by selecting the word select line coupled to their gates. In addition, the word lines coupled to the gates of the unselected memory cells of each string are also driven. However, the unselected memory cells of each string are typically driven by a higher gate voltage so as to operate them as pass transistors and allowing them to pass current in a manner that is unrestricted by their stored data values. Current then flows from the source line to the column bit line through each floating gate/node memory cell of the series coupled string, restricted only by the memory cells of each string that are selected to be read. This places the current encoded stored data values of the row of selected memory cells on the column bit lines. A column page of bit lines is selected and sensed, and then individual data words are selected from the sensed data words from the column page and communicated from the memory device.

Common programming technique for Flash/EEPROM memories programs a bit or row (commonly referred to as a page) of the memory by applying a programming voltage or series of programming voltage pulses to the control gates of the selected memory cells and then programming or inhibiting the selected memory cells to either programmed threshold level (typically to set at logical "0" by the injection of charge to the floating gate or floating node of a memory cell) or inhibited level (the cell is not programmed and left in its original state, usually intended to leave the cell erased and set at logical "1") by coupling the channels of the memory cells to either a program or inhibit voltage. It is noted that some erase operations also include program cycles. These erasure program cycles are typically used to preprogram the cells to a uniform programmed threshold voltage before erasure and to "heal" over-erased memory cells to a uniform erased state threshold voltage afterwards. It is noted that the above described programming operation is for illustrative purposes and should not be taken as limiting.

After programming the selected memory cell(s), a verify operation is then performed to confirm that the data was successfully programmed. If the programmed memory cell(s) fail verification, the program and verify cycle is repeated until the data is successfully programmed or a selected number of iterations have passed and the programming operation is deemed to have failed.

As stated above, common data value reading/sensing technique for Flash/EEPROM memories selects and activates a row page (not shown) of memory cells (and the other memory cells in their associated strings if a NAND architecture array by the application of a read pass voltage applied to the unselected memory cell control gates of the strings) across a selected memory bank of the array by applying a read voltage to their associated control gates. The bit values encoded in programmed or erased threshold voltage levels (typically, for a single level cell, set at logical "0" if programmed by the injection of charge to the floating gate or floating node of a memory cell, raising the threshold voltage of the cell required to make the cell conducting, or, if unprogrammed, left erased and set at logical "1") of the memory cells of the selected row are output by being coupled from a local bit line/string (not shown) to a bit line (not shown) and detected by the sense amplifiers.

Prior art Flash/EEPROM memories the sense amplifiers sense the bit values placed on the bit lines by first pre-charging a voltage on the bit lines before they are coupled to the selected memory cells. The each selected memory cell after it is coupled to the bit line either alters the pre-charged bit line voltage (if it allows current flow to its coupled source line, in other words, is unprogrammed) or does not alter the pre-charged bit line voltage (if it is programmed and its threshold voltage is such that it does not turn on when the control gate read voltage is applied). Multi-level memory cells (MLC's) are read similarly, although differing control gate read voltages are utilized to differentiate between the differing possible programmed threshold voltage states. As such, when a memory cell's programmed state is marginal, the memory cell has been program or read disturbed, or noise levels in the voltage supply are high, errors or mis-reads of the programmed data values can occur. In particular, with MLC cells with their closely spaced logic threshold windows. In addition, with decreasing feature sizes, operating voltage levels, and memory cell array pitch, of modern non-volatile memory devices and arrays these issues are increasing in significance due to smaller current flows through memory cells, larger arrays, longer bit lines, smaller threshold voltage logic windows, and increased potential for memory cell disturb events.

As stated above, embodiments of the present invention include non-volatile memory devices and arrays that sense the programmed threshold voltage levels/data of various cells of non-volatile memory cells utilizing a current sensing data read/verify process and sense amplifier. The current sensing process senses memory cells of a non-volatile memory array utilizing a current sensing process that places a current source, such as a pull-up transistor, to source current on to the bit line. The voltage level of the bit line is then set by current differential on the coupled bit line between the limited current being provided by the current source and the current being sunk from the bit line through the selected memory cell to the source line, which is dependent on the threshold voltage of its programmed or erased state. If the selected memory cell is erased, current flows through the memory cell to the source line and the bit line voltage falls and is sensed by the sense amplifier. If the selected memory cell is programmed, little or no current flows through the cell, dependant on the programmed threshold voltage level of the cell and applied read select voltage on the gate of the memory cell, and the bit line voltage rises and is sensed by the sense amplifier. This allows the sense amplifier to operate without having to precharge the bit line to a known voltage level, as conventional non-volatile memory data sensing process and sense amplifier require. Elimination the need to precharge the bit line speeds the read/sensing process and saves power.

Figure 3A:
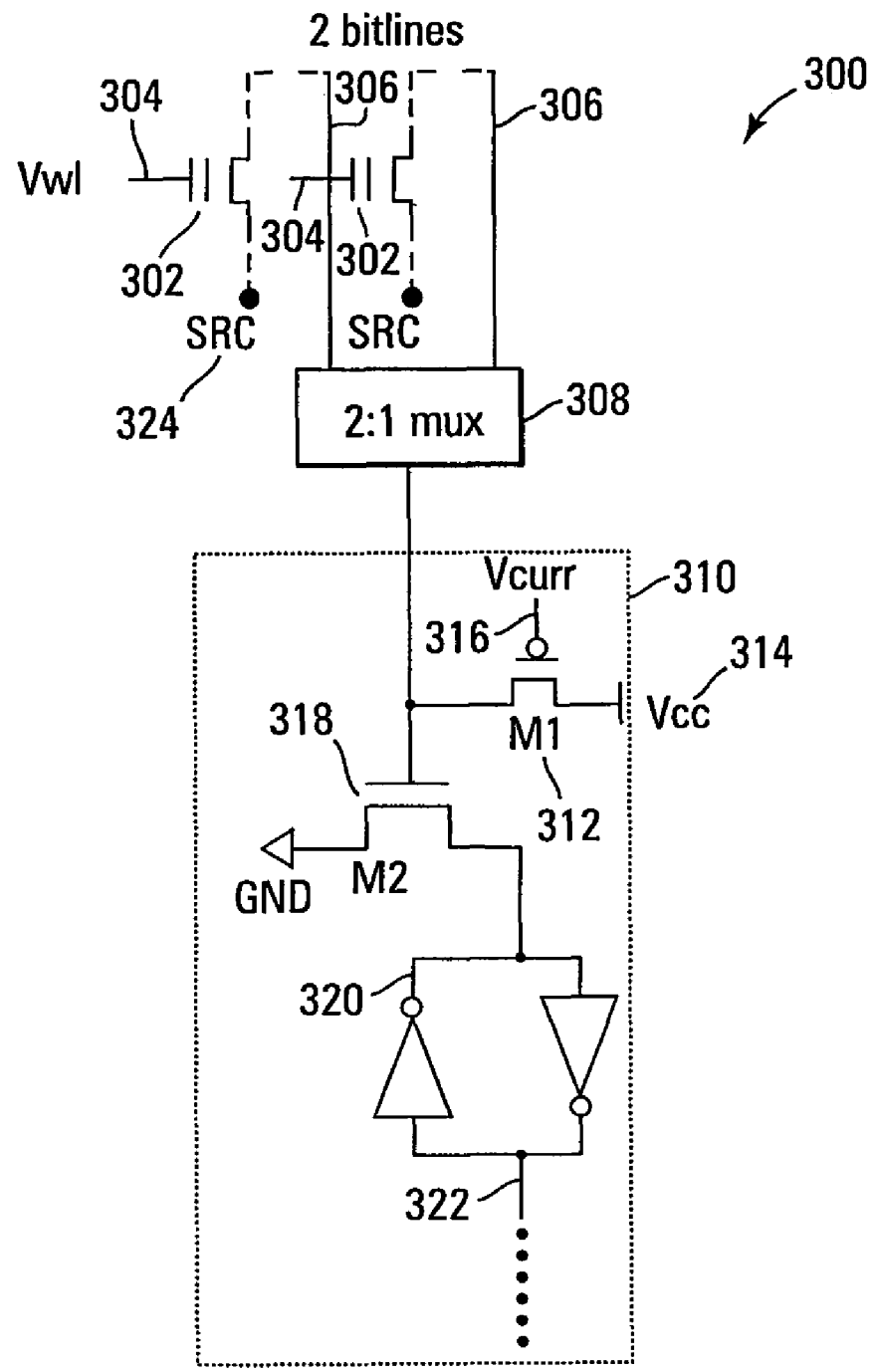
FIGS. 3A-3C show diagrams detailing current sensing and sense amplifiers in accordance with embodiments of the present invention.
Figure 3B:
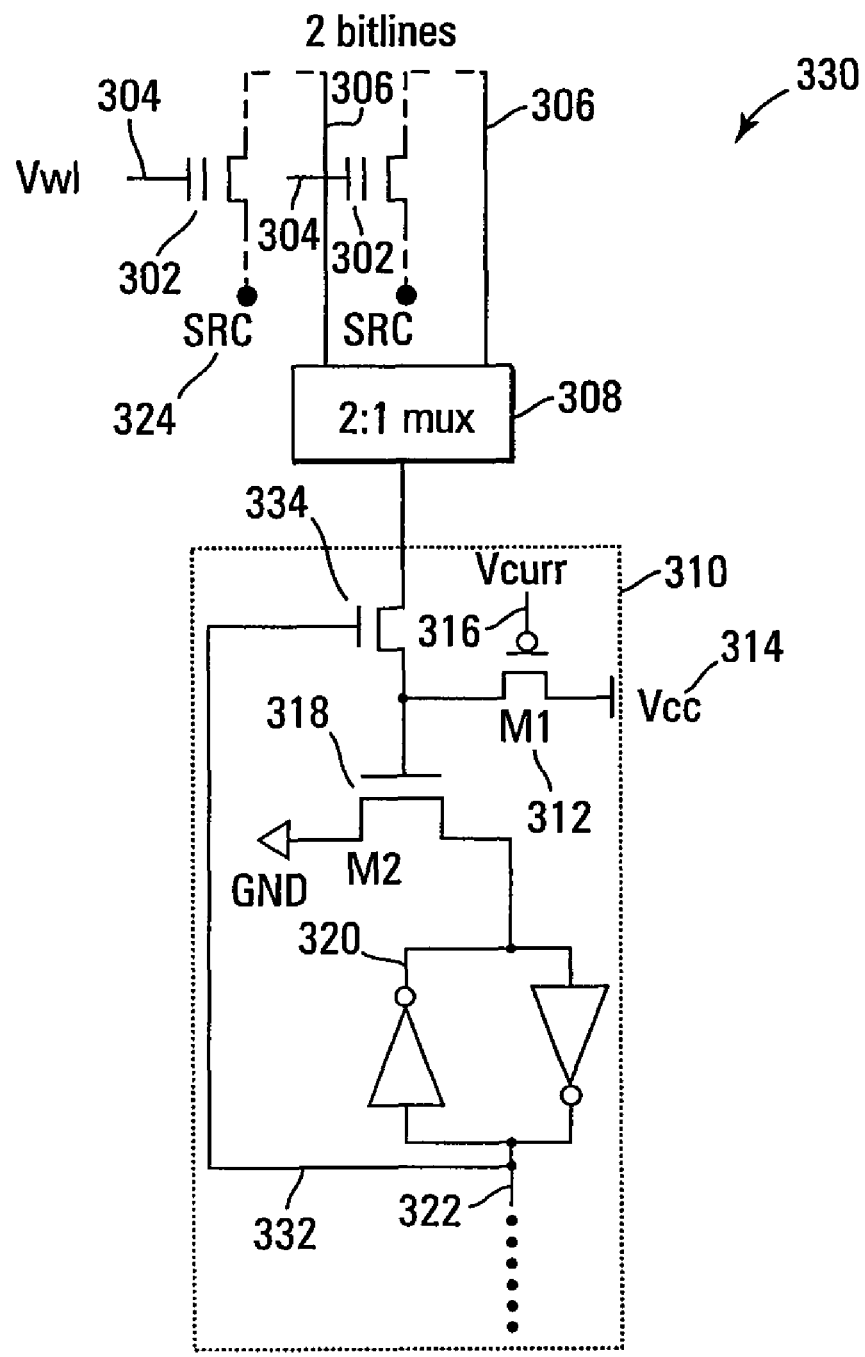
Figure 3C:
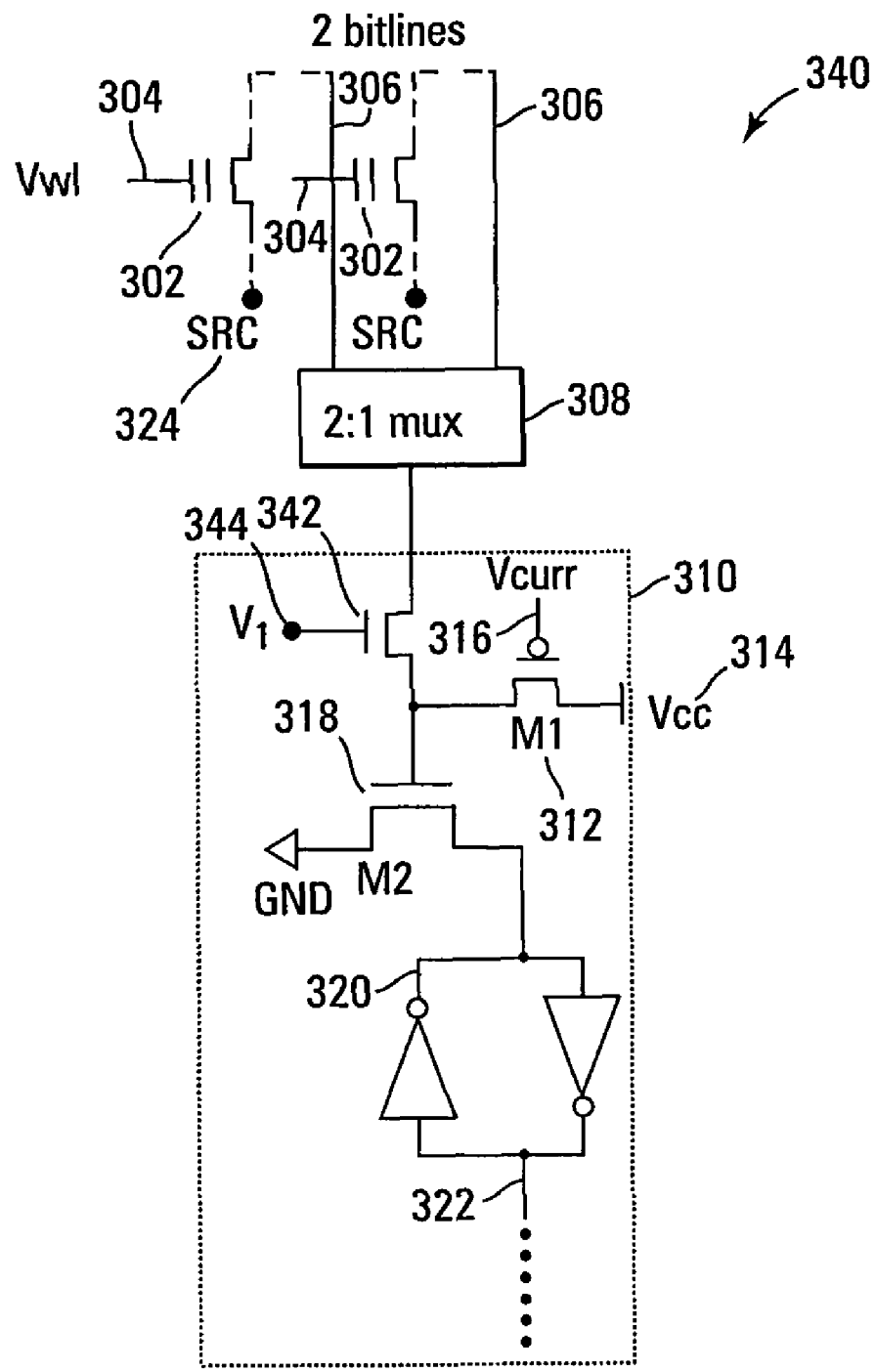

FIGS. 3A, 3B and 3C illustrate a typical NAND architecture memory array and string programming operations of an embodiment of the present invention utilizing a current sensing data read/verify process to sense the programmed threshold voltage levels/data of various cells of non-volatile memory cells. It is noted that the NAND read/sensing operations described in FIGS. 3A, 3B and 3C are for illustrative purposes and should not be taken as limiting. It is also noted that while embodiments of the present invention in FIGS. 3A, 3B and 3C are described in relation to NAND architecture non-volatile read and verify processes, that other memory array architectures, such as NOR architecture memory array and virtual ground memory array embodiments of the present invention, are also possible and will be apparent to those skilled in the art with the benefit of the present invention.

FIG. 3A illustrates an embodiment of a memory 300 of the present invention showing a memory cell of the array being read/sensed. In FIG. 3A, a non-volatile memory cell 302 that has been selected to be read/sensed has a read voltage coupled to its control gate 304 and is coupled to a bit line 306 and a source line 324. The bit lines 306 of the array are coupled to a column multiplexer 308 which selects the bit line 306 and memory cell 302 that is to be coupled to the sense amplifier 310 to be read. The sense amplifier 310 incorporates a current source 312, in the form of a regulated pull-up transistor that is coupled to the selected bit line 306 and provides/sources current on to the bit line 306. If the selected memory cell 302 is erased, it will be fully or partially turned on by the selected read voltage applied to its word line/control gate 304 and current will flow from the coupled bit line 306 through the selected memory cell 302 to the source line 324, which is coupled to ground or another appropriate low voltage potential. This drain of current from the bit line 306 through the erased memory cell 302 will over come the current being provided to the bit line 306 from the current source 312 and lower the voltage potential on the bit line 306. If the memory cell 302 selected to be read is programmed, or otherwise has a threshold voltage high enough that the selected memory cell 302 is not turned on or is only marginally turned on by the selected read voltage applied to its word line/control gate 304, current will not flow from the coupled bit line 306 through the selected memory cell 302 to the source line 324. This allows the current source 312 to raise voltage potential of the bit line.

The raised or lowered voltage potential of the bit line is then sensed by a sensing transistor 318 that has its control gate coupled to the bit line 306. The sensing transistor 318 is coupled to a data latch 320, formed in the sense amplifier 310 by two feedback coupled inverters. The data latch 320 is typically reset to output a known state, such as logical "0" or ground on its output 322 before the memory senses a selected memory cell 302. The sensing transistor 318 is preferably a long channel transistor to allow for greater output variation and sensitivity to changes in bit line voltage. The sensing transistor 318 in FIG. 3A is a long channel NFET transistor that, if the bit line voltage is high (the selected memory cell 302 is programmed), sets the data latch 320 by coupling the input side of the data latch 320 to ground so that it expresses a high voltage/logical "1" on the output 322 of the sense amplifier 310. If the bit line voltage is low, the sensing transistor 318 does not turn on and leaves the data latch 320 in a reset state, outputting a low voltage/logical "0" on the output 322. It is noted that other sensing transistor 318/data latch 320 circuits are possible, such as a PFET transistor coupled to Vcc and a latch formed from cross coupled NAND gates, and will be apparent to those skilled in the art with the benefit of the present disclosure.

As stated above, the current source 312 in the embodiment of FIG. 3A is a regulated PFET pull-up transistor 312 that sources current from the upper power rail/Vcc 314 and has its current sourcing ability regulated by a control voltage, Vcurr, applied to its control gate 316 so that it sources a known current on to the bit line 306. It is noted that, with a PFET transistor 312, as the voltage of the bit line 306 is brought below the voltage level of the control voltage, Vcurr, applied to its control gate, the PFET transistor 312 cuts off and stops flowing current, allowing the bit line 306 voltage potential to be lowered in a quickly by the current flowing through the coupled memory cell 302 and reducing overall power consumption of the sensing circuit. It is also noted that other current sources are possible, including, but not limited to NFET transistors, current mirrors, diode coupled transistors, and pull-up resistors and will be apparent to those skilled in the art with the benefit of the present disclosure. It is further noted that in one embodiment, the current flows are reversed such that the current source 316 is sinking current from the bit line 306.

Current sensing embodiments of the present invention allow for the precharge stage of the read/sensing cycle to be reduced or eliminated, allowing for faster read cycles. In addition, current sensing is more immune to noise and power supply spikes and also allows for decreased sensitivity to disturb conditions and closely spaced threshold voltage levels/logic windows.

FIG. 3B illustrates another embodiment of a memory 330 of the present invention that cuts off current flow from the current source 312 after a successful read of the memory cell 302 in order to reduce power consumption. In FIG. 3B, a non-volatile memory cell 302 that has been selected to be read/sensed has a read voltage coupled to its control gate 304 and is coupled to a bit line 306 and a source line 324. The selected bit line 306 of the array is coupled to the sense amplifier 310 to be read through the column multiplexer 308. The sense amplifier 310 incorporates a current source 312, in the form of a regulated pull-up transistor that is coupled to the selected bit line 306 and provides/sources current on to the bit line 306. If the selected memory cell 302 is erased, it will be turned on by the selected read voltage applied to its word line/control gate 304 and current will flow from the coupled bit line 306 through the selected memory cell 302 to the source line 324. If the memory cell 302 selected to be read is programmed, or otherwise has a threshold voltage high enough that the selected memory cell 302 is not turned on or is only marginally turned on by the selected read voltage applied to its word line/control gate 304, current will not flow from the coupled bit line 306 through the selected memory cell 302 to the source line 324. This allows the current source 312 to raise voltage potential of the bit line. The raised or lowered voltage potential of the bit line is then sensed by a sensing transistor 318 that has its control gate coupled to the bit line 306 and the value coupled to the data latch 320 and the output 322 of the sense amplifier 310. In addition, in sense amplifier 310 of FIG. 3B, a current isolation transistor 334 is placed between the incoming bit line 306 and the current source 312. The current isolation transistor 334 has its control gate coupled 332 to the output 322 of the sense amplifier 310 such that, once a logical "1" data value is latched in to the data latch 320 (i.e., the current source 312 has raised the voltage potential of the bit line 306 after having been coupled to a programmed memory cell 302), the current source 312 is isolated from the coupled bit line 306 by the isolation transistor 334, preventing further current flow and reducing power usage.

FIG. 3C illustrates yet another embodiment of a memory 340 of the present invention that utilizes a cascade amplifier. In FIG. 3C, a non-volatile memory cell 302 that has been selected to be read/sensed has a read voltage coupled to its control gate 304 and is coupled to a bit line 306 and a source line 324. The selected bit line 306 of the array is coupled to the sense amplifier 310 to be read through the column multiplexer 308. The sense amplifier 310 incorporates a current source 312, in the form of a regulated pull-up transistor that is coupled to the selected bit line 306 and provides/sources current on to the bit line 306. If the selected memory cell 302 is erased, it will be turned on by the selected read voltage applied to its word line/control gate 304 and current will flow from the coupled bit line 306 through the selected memory cell 302 to the source line 324. If the memory cell 302 selected to be read is programmed, or otherwise has a threshold voltage high enough that the selected memory cell 302 is not turned on or is only marginally turned on by the selected read voltage applied to its word line/control gate 304, current will not flow from the coupled bit line 306 through the selected memory cell 302 to the source line 324. This allows the current source 312 to raise voltage potential of the bit line. The raised or lowered voltage potential of the bit line is then sensed by a sensing transistor 318 that has its control gate coupled to the bit line 306 and the value coupled to the data latch 320 and the output 322 of the sense amplifier 310.

In addition, in sense amplifier 310 of FIG. 3C, similar to FIG. 3B, a transistor 342 is placed between the incoming bit line 306 and the current source 312. However, transistor 342 has its control gate coupled to a control voltage, V1, 344 instead of the output 322 of the sense amplifier 310. This allows the transistor 342 to operate as a cascade amplifier in conjunction with the sensing transistor 318, such that, if the memory cell is programmed (no current flow) and V1 is less than the voltage at the source of transistor 342 (the voltage at the sensing transistor 318/current source 312), transistor 342 cuts off. This isolates the bit line from the sense amplifier 310 and allowing for a faster pull-up of the voltage potential at the sensing transistor 318 by the current source 312. It is noted that transistor 342, like the sensing transistor 318, is preferably also a long channel transistor. It is further noted that transistor 342 can also be a transistor that is utilized in the multiplexer 308 and serves a dual purpose in forming part of the cascade amplifier.

In one embodiment of the present invention, a long channel transistor (a FET transistor that has a longer channel than the common channel lengths and feature sizes of the semiconductor manufacturing process being utilized and therefore has a more linear transfer function and thus a more resistive nature and a lower saturation current for a given control gate voltage) or a current source with a higher internal resistance is utilized as the current source 312 of FIGS. 3A-3C to allow higher sensitivity to current flow through the selected non-volatile memory cell by having a lower saturation current. In yet another embodiment, the sensing transistor 318 of FIGS. 3A-3C is a long channel transistor to allow for greater sensitivity to bit line voltage through a having a higher resistive nature. In a further embodiment, the word line voltage level (Vwl) and current source control voltage (Vcurr) are set to specific levels based on the threshold voltage group to be sensed in the memory cells. In yet a further embodiment, the word line voltage level (Vwl) is held at a selected level and the current source control voltage (Vcurr) is varied to sense for differing cell currents/threshold voltage levels.

In yet another embodiment of the present invention, the current sensing allows for improved threshold voltage (Vt) redistribution for multi-level cell Flash memory by allowing for negative voltage Vt's to be easily utilized and sensed. This makes the highest Vt of the programmed/erased cell smaller, improving data retention and reducing program voltages and the potential for memory cell disturb.

It is noted that the read/sensing operations and voltage levels of FIGS. 3A-3C are for illustrative purposes and should not be taken as limiting.

Figure 4:
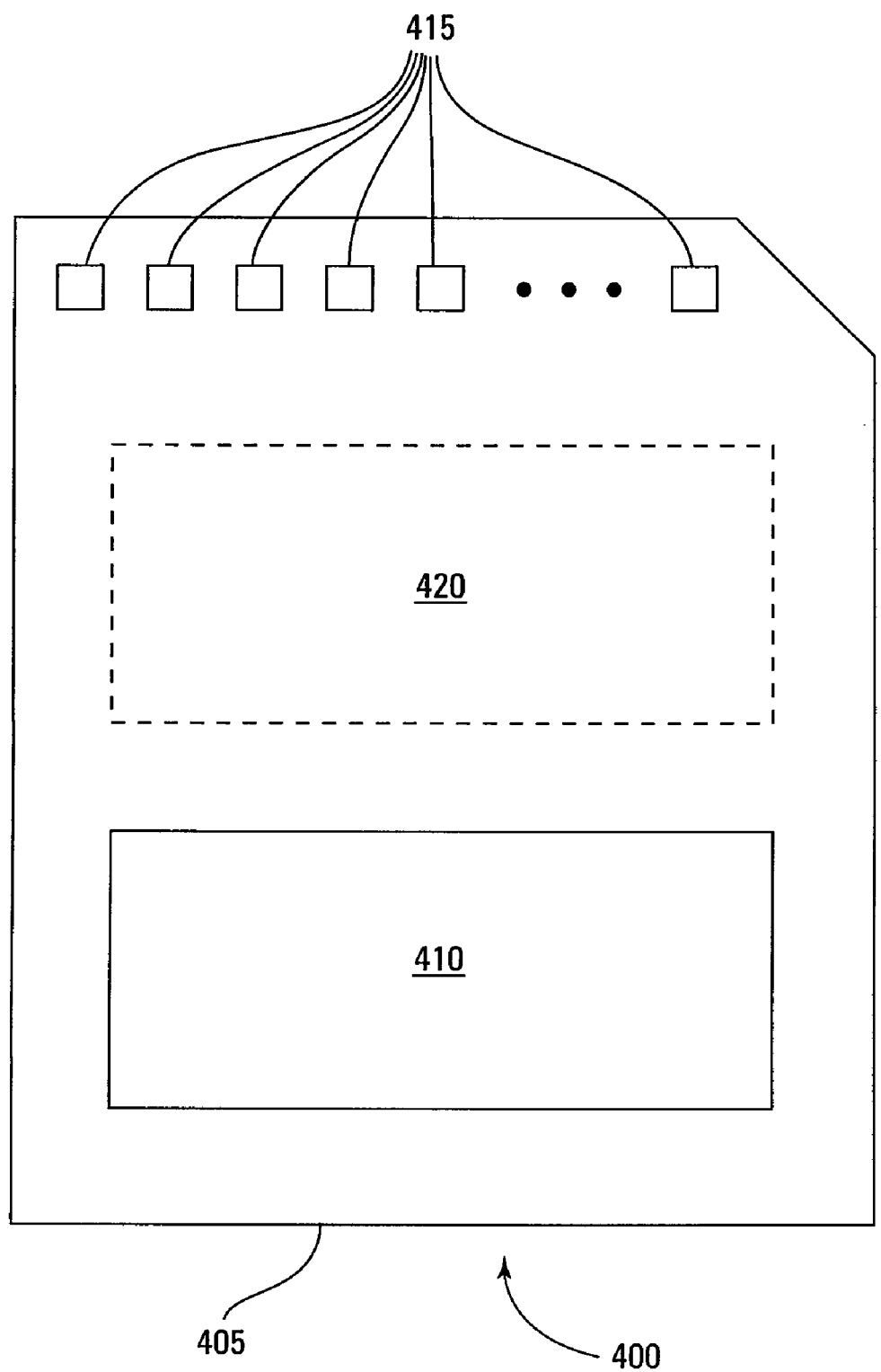
FIG. 4 is a simplified block diagram of a memory module in accordance with an embodiment of the present invention.

FIG. 4 is an illustration of an exemplary memory module 400. Memory module 400 is illustrated as a memory card, although the concepts discussed with reference to memory module 400 are applicable to other types of removable or portable memory, e.g., USB flash drives, and are intended to be within the scope of "memory module" as used herein. In addition, although one example form factor is depicted in FIG. 4, these concepts are applicable to other form factors as well.

In some embodiments, memory module 400 will include a housing 405 (as depicted) to enclose one or more memory devices 410, though such a housing is not essential to all devices or device applications. At least one memory device 410 is a non-volatile memory including circuits of or adapted to perform elements of methods of the present invention. Where present, the housing 405 includes one or more contacts 415 for communication with a host device. Examples of host devices include digital cameras, digital recording and playback devices, PDAs, personal computers, memory card readers, interface hubs and the like. For some embodiments, the contacts 415 are in the form of a standardized interface. For example, with a USB flash drive, the contacts 415 might be in the form of a USB Type-A male connector. For some embodiments, the contacts 415 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 415 provide an interface for passing control, address and/or data signals between the memory module 400 and a host having compatible receptors for the contacts 415.

The memory module 400 may optionally include additional circuitry 420 which may be one or more integrated circuits and/or discrete components. For some embodiments, the additional circuitry 420 may include a memory controller for controlling access across multiple memory devices 410 and/or for providing a translation layer between an external host and a memory device 410. For example, there may not be a one-to-one correspondence between the number of contacts 415 and a number of I/O connections to the one or more memory devices 410. Thus, a memory controller could selectively couple an I/O connection (not shown in FIG. 4) of a memory device 410 to receive the appropriate signal at the appropriate I/O connection at the appropriate time or to provide the appropriate signal at the appropriate contact 415 at the appropriate time. Similarly, the communication protocol between a host and the memory module 400 may be different than what is required for access of a memory device 410. A memory controller could then translate the command sequences received from a host into the appropriate command sequences to achieve the desired access to the memory device

410. Such translation may further include changes in signal voltage levels in addition to command sequences.

The additional circuitry 420 may further include functionality unrelated to control of a memory device 410 such as logic functions as might be performed by an ASIC (application specific integrated circuit). Also, the additional circuitry 420 may include circuitry to restrict read or write access to the memory module 400, such as password protection, biometrics or the like. The additional circuitry 420 may include circuitry to indicate a status of the memory module 400. For example, the additional circuitry 420 may include functionality to determine whether power is being supplied to the memory module 400 and whether the memory module 400 is currently being accessed, and to display an indication of its status, such as a solid light while powered and a flashing light while being accessed. The additional circuitry 420 may further include passive devices, such as decoupling capacitors to help regulate power requirements within the memory module 400.

It is noted that other current sensing read/verify operations, sense amplifiers, non-volatile memory array architectures, and voltage levels for non-volatile memory device and array embodiments of the present invention are possible and will be apparent for those skilled in the art with the benefit of this disclosure.

CONCLUSION

A current sensing data read/verify process and sense amplifier is described that senses memory cells of a non-volatile memory array utilizing a current sensing process that places a current source, such as a pull-up transistor, to source current on to the bit line. The voltage level of the bit line is then set by current differential on the coupled bit line between current provided by the current source in the sense amplifier and the current sunk from the bit line through the selected memory cell to the source line, which is dependent on the threshold voltage of its programmed or erased state. If the selected memory cell is erased, current flows through the memory cell to the source line and the bit line voltage falls and is sensed by the sense amplifier. If the selected memory cell is programmed, little or no current flows through the cell, dependant on the programmed threshold voltage level of the cell and applied read select voltage on the gate of the memory cell, and the bit line voltage rises and is sensed by the sense amplifier. This allows the sense amplifier to operate without having to precharge the bit line, as a conventional sense amplifier would. In one embodiment, the sense amplifier current source is turned off after a data value has been sensed to reduce power consumption. In another embodiment, a transistor is coupled serially in line with the bit line to form a cascade amplifier.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of sensing a data value in a memory cell of a non-volatile NAND architecture memory string, comprising:
   applying a read voltage to a selected word line coupled to a selected non-volatile memory cell of the NAND architecture memory string that is selected for reading;
   applying a pass voltage to one or more unselected word lines and coupled non-volatile memory cells of the non-volatile NAND architecture memory string;
   coupling the non-volatile NAND architecture memory string to a source line and a bit line;
   sourcing current from a current source on to the bit line;
   using the current from the current source while the read voltage is applied to the selected word line coupled to the selected non-volatile memory cell, increasing a voltage of the bit line if the selected non-volatile memory cell is deactivated in response to the read voltage;
   sensing the voltage of the bit line at a control gate of a transistor to determine the data value stored in the selected non-volatile memory cell of the non-volatile NAND architecture memory string; and
   using the sensing of the voltage of the bit line to selectively isolate the selected non-volatile memory cell from the current source.

2. The method of claim 1, wherein sourcing current from a current source on to the bit line further comprises sourcing current from a current source having a higher internal resistance than the selected non-volatile memory cell if it is activated in response to the read voltage.

3. The method of claim 1, wherein sourcing current from a current source on to the bit line further comprises sourcing current from a current source limited by a saturation current of a transistor.

4. The method of claim 1, further comprising turning off the current source after sensing the voltage of the bit line.

5. The method of claim 1, wherein sensing the voltage of the bit line to determine the data value stored in the selected non-volatile memory cell of the non-volatile NAND architecture memory string further comprises sensing the voltage of the bit line by amplifying a voltage change of the bit line by restricting current flow to the non-volatile NAND architecture memory string as the voltage of the bit line increases.

6. The method of claim 5, wherein amplifying a voltage change of the bit line by restricting current flow to the non-volatile NAND architecture memory string as the voltage of the bit line increases further comprises amplifying a voltage change by isolating the bit line from the current source as the voltage increases.

7. The method of claim 1, wherein sourcing current from a current source on to the bit line further comprises sinking a current from the bit line through the current source.

8. The method of claim 1, further comprising precharging the bit line to a selected voltage before coupling the non-volatile NAND architecture memory string to the bit line.

9. A method of operating sense amplifier, comprising:
   sourcing current from a current source on to a coupled bit line while the bit line is coupled to a memory cell selected for reading;
   using the current from the current source while a read voltage is applied to the selected memory cell, increasing a voltage potential of the bit line if the selected memory cell is deactivated in response to the read voltage;
   sensing the voltage potential of the bit line at a control gate of a transistor to determine the data value stored in the selected memory cell; and
   using the sensing of the voltage potential of the bit line to selectively isolate the selected memory cell from the current source.

10. The method of claim 9, wherein sourcing current from a current source on to a coupled bit line further comprises sourcing current from a current source having a higher internal resistance than the selected memory cell if it is activated in response to the read voltage.

11. A sense amplifier, comprising:
an isolation transistor coupled to a bit line connection of the sense amplifier;
a current source, wherein the current source is selectively coupled to the bit line connection through the isolation transistor;
a sensing transistor having a control gate selectively coupled to the bit line connection through the isolation transistor and a first source/drain region coupled to a ground, wherein the isolation transistor is
coupled to operate as a cascade amplifier in conjunction with the sensing transistor; and
a data latch coupled to a second source/drain region of the sensing transistor.

12. The sense amplifier of claim 11, wherein the current source is a current source limited by a saturation current of a transistor.

13. The sense amplifier of claim 11, wherein the current source is one of a PFET transistor, a NFET transistor, a long channel PFET transistor, a long channel NFET transistor, a diode coupled transistor, a resistor, and a current mirror.

14. The sense amplifier of claim 11, wherein the current source is adapted to provide one of a selected current sunk from the bit line connection and a selected current sourced to the bit line connection.

15. A sense amplifier, comprising:
a current source, wherein the current source is coupled to a bit line connection of the sense amplifier;
a sensing transistor having a control gate coupled to the bit line connection and a first source/drain region coupled to a ground;
an isolation transistor between the current source and the bit line connection and coupled to operate as a cascade amplifier in conjunction with the sensing transistor; and
a data latch coupled to a second source/drain region of the sensing transistor;
wherein the sensing transistor is a long channel transistor, where the long channel transistor has a channel length greater than one and a half times the channel length of a conventional transistor of a semiconductor manufacturing process utilized to form the sense amplifier.

16. The sense amplifier of claim 11, wherein the first source/drain region of the sensing transistor is coupled to a power rail.

17. A sense amplifier, comprising:
a current source, wherein the current source is coupled to a bit line connection of the sense amplifier;
a sensing transistor having a control gate coupled to the bit line connection and a first source/drain region coupled to a ground;
an isolation transistor between the current source and the bit line connection and coupled to operate as a cascade amplifier in conjunction with the sensing transistor; and
a data latch coupled to a second source/drain region of the sensing transistor;
wherein the isolation transistor is a long channel NFET transistor, where the long channel transistor has a channel length greater than one and a half times the channel length of an average feature sized transistor of a semiconductor manufacturing process utilized to form the sense amplifier.

18. A non-volatile memory device, comprising:
a non-volatile memory array having a plurality of non-volatile memory cells, wherein each non-volatile memory cell has a control gate coupled to a word line, and first and second source/drain regions that are selectively coupleable to a bit line and a source line; and
a plurality of sense amplifiers, wherein each sense amplifier of the plurality of sense amplifiers is selectively coupled to one or more associated bit lines and comprises, an isolation transistor coupled to a selected associated bit line coupled to the sense amplifier;
a current source selectively coupled to the selected associated bit line through the isolation transistor, wherein the current source is adapted to source current on to the selected associated bit line;
a sensing transistor having a control gate selectively coupled to the selected associated bit line through the isolation transistor and a source region coupled to a ground, wherein the isolation transistor is coupled to operate as a cascade amplifier in conjunction with the sensing transistor; and
a data latch coupled to a drain region of the sensing transistor.

19. The non-volatile memory device of claim 18, further comprising a plurality of multiplexers, wherein a multiplexer of the plurality of multiplexers is coupled between each sense amplifier and the one or more associated bit lines.

20. A non-volatile NAND architecture memory device, comprising:
a NAND architecture non-volatile memory array having a plurality of memory blocks;
a sense amplifier circuit coupled to the array; and
a control circuit, wherein the control circuit is adapted to read memory cells in a selected memory block of the non-volatile memory array by,
applying a read voltage to a selected word line coupled to a selected non-volatile memory cell of a NAND architecture memory string that is selected for reading,
applying a pass voltage to one or more unselected word lines and coupled non-volatile memory cells of the non-volatile NAND architecture memory string,
coupling the non-volatile NAND architecture memory string to a source line and a bit line,
coupling the sense amplifier circuit to the bit line,
sourcing current from a current source on to the bit line,
using the current from the current source while the read voltage is applied to the selected word line coupled to the selected non-volatile memory cell, increasing a voltage of the bit line if the selected non-volatile memory cell is deactivated in response to the read voltage;
sensing the voltage of the bit line at a control gate of a transistor to determine the data value stored in the selected non-volatile memory cell of the non-volatile NAND architecture memory string; and using the sensing of the voltage of the bit line to selectively isolate the selected non-volatile memory cell from the current source.

21. The method of claim 1, wherein sensing the voltage of the bit line at a control gate of a transistor comprises applying the voltage of the bit line to the control gate of a transistor having a first source/drain region coupled to receive a ground potential and having a second source/drain region coupled to a data latch.

22. The method of claim 9, wherein sensing the voltage potential of the bit line at a control gate of a transistor comprises applying the voltage potential of the bit line to the control gate of a transistor having a first source/drain region coupled to receive a ground potential and having a second source/drain region coupled to a data latch.

23. The method of claim 9, wherein sourcing current from a current source on to a coupled bit line further comprises sourcing current from a current source limited by a saturation current of a transistor.

24. The sense amplifier of claim 11, wherein a control gate of the isolation transistor is coupled to a control voltage and not an output of the sense amplifier.

25. The sense amplifier of claim 11, wherein the control gate of the sensing transistor and the current source are coupled to a same source/drain region of the isolation transistor.

26. The non-volatile memory device of claim 18, wherein a control gate of the isolation transistor is coupled to a control voltage and not an output of the sense amplifier.

27. The non-volatile memory device of claim 18, wherein the control gate of the sensing transistor and the current source are coupled to a same source/drain region of the isolation transistor.

* * * * *